United States Patent [19]
Rambo et al.

[11] Patent Number: 5,742,207
[45] Date of Patent: Apr. 21, 1998

[54] TRACKING LOOP HAVING INSTANTANEOUS FREQUENCY SHIFT PROTECTION

[75] Inventors: Jeffery C. Rambo, Cedar Rapids; Thomas W. Laraway, Marion, both of Iowa

[73] Assignee: Rockwell International Corporation, Costa Mesa, Calif.

[21] Appl. No.: 687,045

[22] Filed: Jul. 25, 1996

[51] Int. Cl.⁶ .................................................... H03L 7/087
[52] U.S. Cl. ........................ 331/11; 331/17; 331/25; 327/156; 455/260
[58] Field of Search ........................... 331/10–12, 14, 331/16, 17, 23, 25, DIG. 2; 327/156–159; 329/307, 325; 375/376; 455/260

[56] References Cited

U.S. PATENT DOCUMENTS 5,444,420  8/1995  Wernlund .............................. 331/14 X Primary Examiner—David Mis
Attorney, Agent, or Firm—Kyle Eppele; L. Keith Stephens; James P. O'Shaughnessy

[57] ABSTRACT

A system for processing signals by utilizing a tracking loop that contains two or more detectors that operate simultaneously in order to detect a frequency shift in the locally generated reference signal. A correction can then be transmitted to the tracking loop filter to minimize the effect of the detected frequency shift. In this manner lock can be maintained without the expenditures associated with the use of temperature controlled or compensated oscillators.

20 Claims, 3 Drawing Sheets

TRACKING LOOP HAVING INSTANTANEOUS FREQUENCY SHIFT PROTECTION

FIELD OF INVENTION

The present invention relates generally to tracking of signals and more particularly to phase tracking of transmitted signals and most particularly to the phase tracking utilizing multiple detectors in the tracking loop in order to minimize the effects of instantaneous frequency changes in the reference oscillator.

BACKGROUND OF THE INVENTION

A tracking loop is a circuit that permits an external signal to be matched with a locally generated signal by controlling its frequency and phase. The frequency of the local signal is derived from a reference oscillator frequency. The loop oscillator frequency can be the same or a multiple of the reference frequency. When the tracking loop is in "lock", the frequencies of the external signal are identical to the locally generated signal frequency. A phase detector is generally used to monitor any phase difference between the external signal and the locally generated signal in order to correct the locally generated signal frequency to maintain loop lock. Phase differences are the composite result of Doppler effects on the transmitting and received antenna, as well as differences in the transmitter and receiver reference oscillators.

Numerous advances in current electronics raise user expectations with respect to product performance, reliability and cost. For example, the global positioning satellite (GPS) market has been demanding new products that are cheaper, lighter, lower power and more reliable with no degradation in performance. In order for GPS receivers to achieve their required accuracy and tracking reliability, narrow bandwidth tracking loops must maintain lock on the signal and to demodulate its data. The effectiveness of the tracking loop relates directly to the reference oscillator's short term stability. Prior art GPS receivers rely upon temperature controlled oscillators to achieve the necessary short term stability. However, such technical designs are significantly limited in their size, power and cost reduction. An alternate technique is the use of a variety of compensated oscillator schemes, however, some of the same limitations as the temperature controlled techniques still apply.

In addition to the above described limitations to emerging market expectations, the above described solutions have inherent limitations. For example, compensated oscillators, due to crystal imperfections, are known to sometimes experience instantaneous shifts in their output frequency, especially when undergoing thermal cycling, mechanical stress or mechanical shock. The instantaneous shifts have been observed to cause the existing tracking loops to break lock, which degrades both the receiver's tracking reliability and accuracy performance. The instantaneous shift is believed to be a physical phenomena. It is not known how to eliminate all imperfections in the manufacturing process, and individual oscillator screening is often cost prohibitive.

Existing tracking loops use detectors to determine the frequency and phase relationship of the locally generated signal with the incoming signals. Instantaneous shifts in the reference oscillator can create frequency errors in the locally generated signal that are outside the narrow bandwidth detector's ability to maintain lock. A wider bandwidth detector has the ability to observe the instantaneous shift but degrades the accuracy and reliability of the tracking loop.

Accordingly, there exists a need for a tracking loop having integrated compensation devices for minimizing the effects of instantaneous shift in the reference oscillator.

SUMMARY OF THE INVENTION

The present invention comprises a system for yielding a highly reliable and accurate tracking loop utilized in tracking and demodulating phase modulated signals. The invention comprises a tracking loop having a plurality of phase detectors operating simultaneously, in order to identify and correct frequency shifting in the loop generated reference signal. An input carrier signal is sampled for phase measurements at different rates by independent detectors and the resultant measurements are compared. If an established threshold value is exceeded in the magnitude of the difference in the phase measurements, a frequency shift is declared. As an additional step, a correction mechanism is implemented whereby the shorter interval sampled signal value is utilized to reduce the phase loop filter and to change the loop coefficients in order to accommodate the detected change.

In one embodiment of the present invention, a GPS receiver is constructed so as to have two arctangent phase detectors operating simultaneously in a tracking loop. The particular tracking loop is an extended range phase lock loop allowing the accumulation of multiple cycles of stand-off error without losing lock. Other loop designs such as Costas phase lock or frequency lock loops could also be utilized. One detector is operated at a pre-detection integration interval of twenty milliseconds, to provide high fidelity signal quality, and the other detector is operated at a pre-detection integration interval of five milliseconds, in order to provide greater sensitivity to an instantaneous change in the processed signal value. The phase differences of the detectors are compared and if a ninety degree threshold is exceeded a phase shift is declared, and the five millisecond detector values are used to accommodate the sudden frequency change.

It is an object of the present invention to provide a tracking loop adaptive to instantaneous locally generated frequency shifts.

It is a feature of the present invention to utilize a plurality of detectors, operating simultaneously at different sampling rates, in a tracking loop.

It is yet another feature of the present invention to eliminate the need for temperature controlled oscillators in tracking loops.

It is an advantage of the present invention that the system cost and size are reduced over prior art systems having similar operating parameters.

These and other objects, features and advantages are disclosed and claimed in the specification, figures, and claims of the present application.

DETAILED DESCRIPTION OF THE PREFERRED EMBODIMENTS

Figure 1:
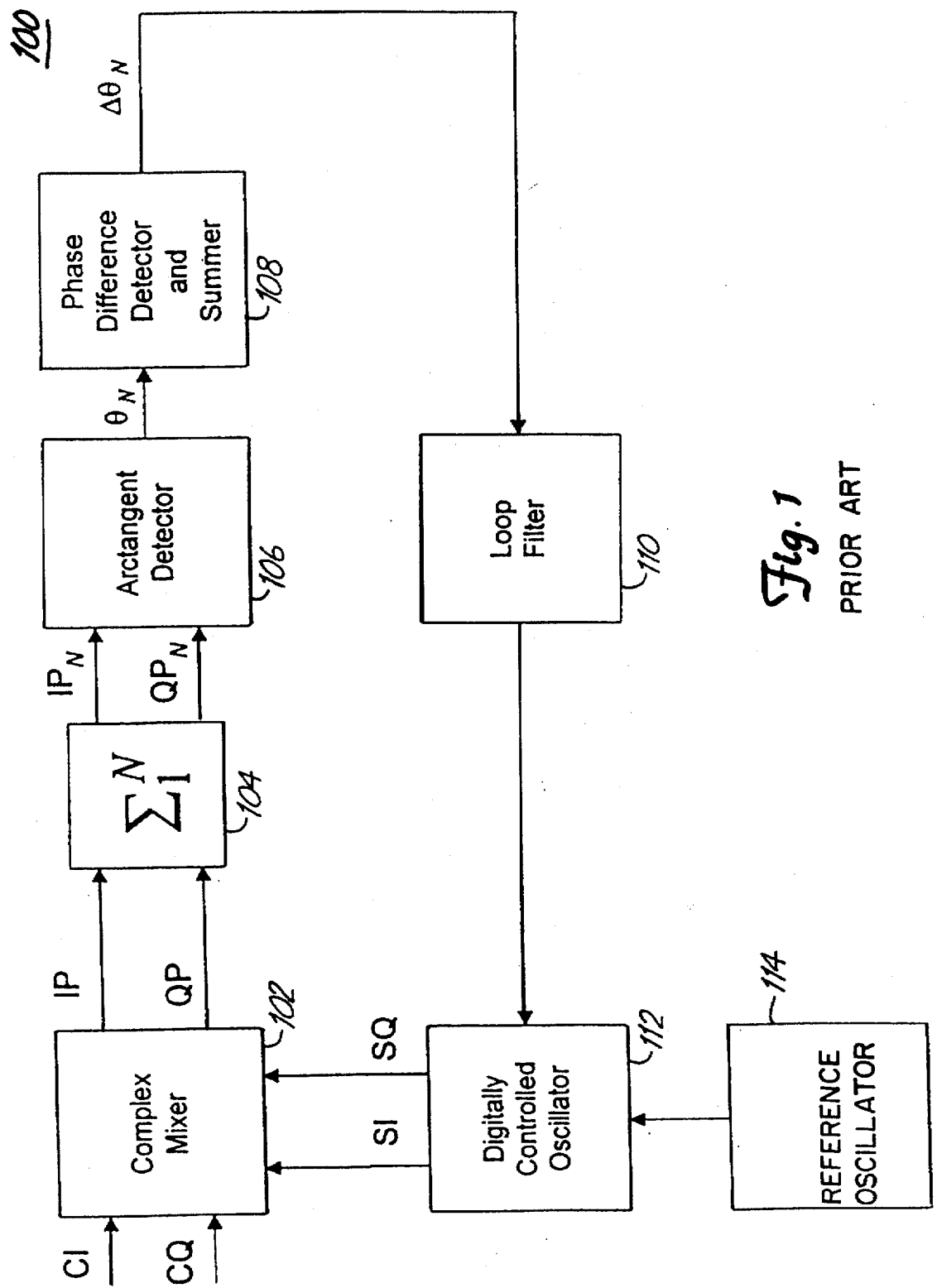
FIG. 1 illustrates a block diagram of a receiver having a tracking loop, as known in the prior art.

Referring now to the drawings, wherein like items are referenced as such throughout, FIG. 1 illustrates a typical prior art tracking loop 100. A complex mixer 102 receives external input signals from antenna/tuner means (not shown), and locally generated signals. The external signals, CI and CQ, and locally generated signals SI and SO, contain both in-phase and quadrature phase components. The complex mixer generates in-phase, IP, and quadrature phase, QP, correlation signals which are coherently integrated 104 over a pre-detection integration interval N. The correlation signals are provided to an arctangent detector 106 which determines the phase relationship between the input signal and the locally generated signal. The output of the arctangent detector is then phase differenced 108 and summed in order to determine the phase change, if any, since the last sample. The phase difference is then filtered 110 and coupled back to the digitally controlled oscillator (DCO) 112 to maintain lock with the input signal. The base frequency of the DCO is derived from the reference oscillator 114.

Variations in the operating environment such as, thermal cycling, mechanical stress or shock, could result in the reference oscillator instantaneously changing frequency, thereby resulting in a loss of "lock" of the loop on the input signal. As previously mentioned such loss of lock is often countered by the use of specially designed oscillators that are compensated for temperature fluctuations or operate in a controlled environment. The associated circuitry, power and space for such temperature controlled or compensated oscillators is often quite high in cost and in some instances inconsistent with overall design goals of the underlying system or device.

Figure 2:
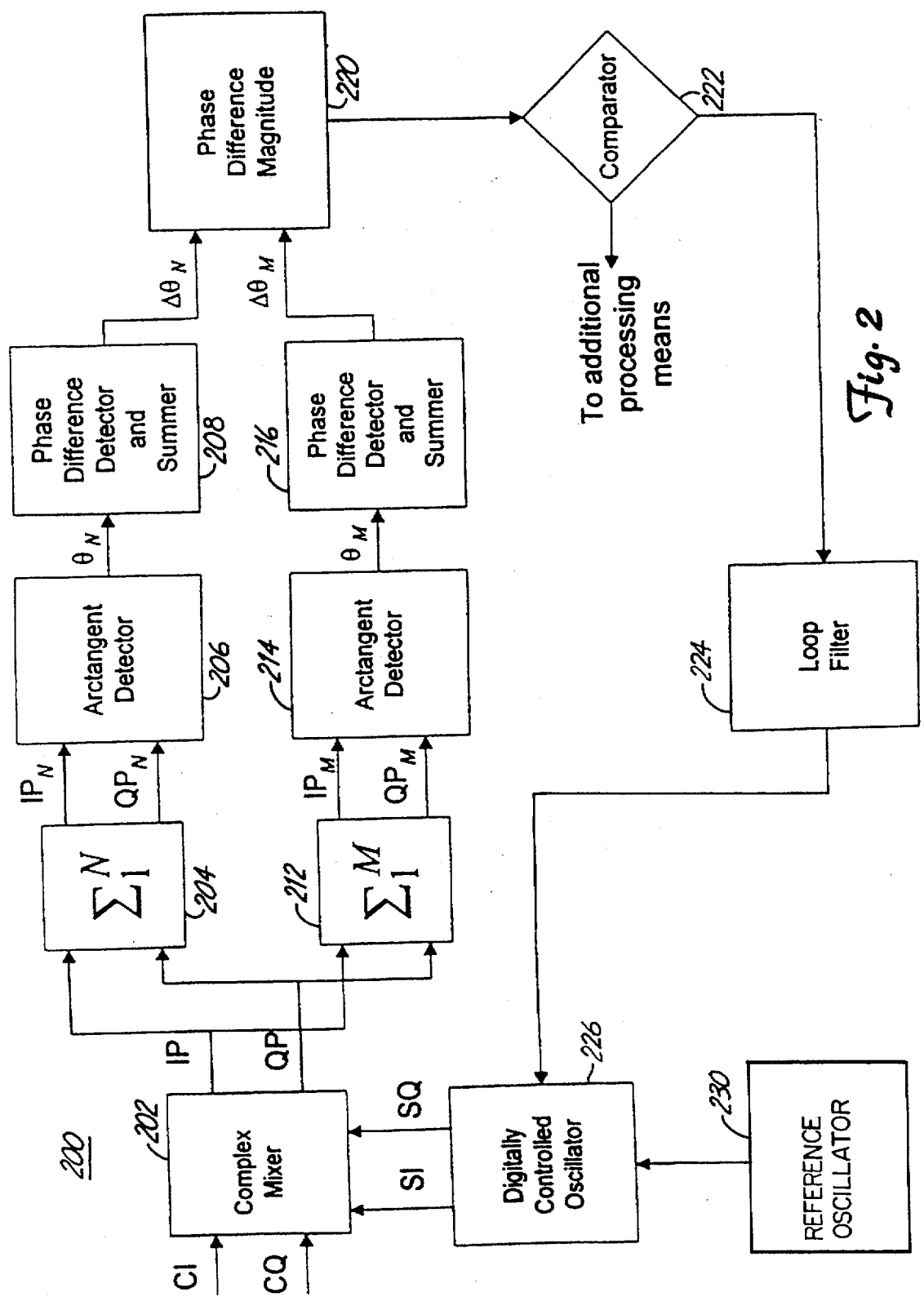
FIG. 2 illustrates the a block diagram of a receiver incorporating one implementation of the teachings of the present invention.

FIG. 2 illustrates a tracking loop 200 that implements one embodiment of the teachings of the present invention. A complex mixer 202 receives external input signals from antenna/tuner means (not shown) and locally generated signals. The external signals, CI and CQ, and locally generated signals, SI and SQ, contain both in-phase and quadrature phase components. The complex mixer generates in-phase, IP, and quadrature phase, QP, correlation signals. A first detector channel is comprised of a first integrator element 204, an arctangent detector 206, a phase difference detector and summer 208. The detector comprising the first above channel is operated at a predetermined interval, N an integer value, selected, in order to provide a high sensitivity in detecting a change in the local reference oscillator. Similarly, a second detector channel comprised of a first integrator element 212, an arctangent detector 214, and a phase difference detector and summer 216. The second detector channel is simultaneously operated at a different interval M, an integer value greater than N, in order to accommodate high fidelity signal measurements. For purposes of this illustration, a pre-detection interval of five milliseconds was utilized for N and twenty milliseconds for M, consistent with a known parameter of the GPS signal. It is understood that alternate values as well as additional detector channels, such as a third, fourth, fifth and so on, could be utilized dependent upon the desired signal characteristics and receiver accuracy.

The output signal of each detector channel is coupled to a circuit element that determines the magnitude of the phase difference in the two signals, phase difference means 220. The value of the magnitude of the difference is coupled to a comparator 222, which in turn provides a phase correction signal to a loop filter 224 when a phase shift is detected at the comparator 220. A DCO 226 receives the output signal of the loop filter 224, as its frequency command and in turn provides a complex input signal SI and QI to the complex mixer 202 and the operation repeats. The base frequency of the DCO is derived from the reference oscillator 230.

It should be noted that the entire structure depicted in FIG. 2 can be implemented as a function within an integrated device, constructed in accordance with semiconductor processes that are well known in the art field. It is also worth noting that shorter sampling periods provide greater instantaneous change information but fail to provide long-term desired signal quality. Thus, the values assigned to the sampling periods for each detector channel should reflect the best mix of response to detected change balanced against overall signal quality, within the timing parameters of a given received signal.

Figure 3:
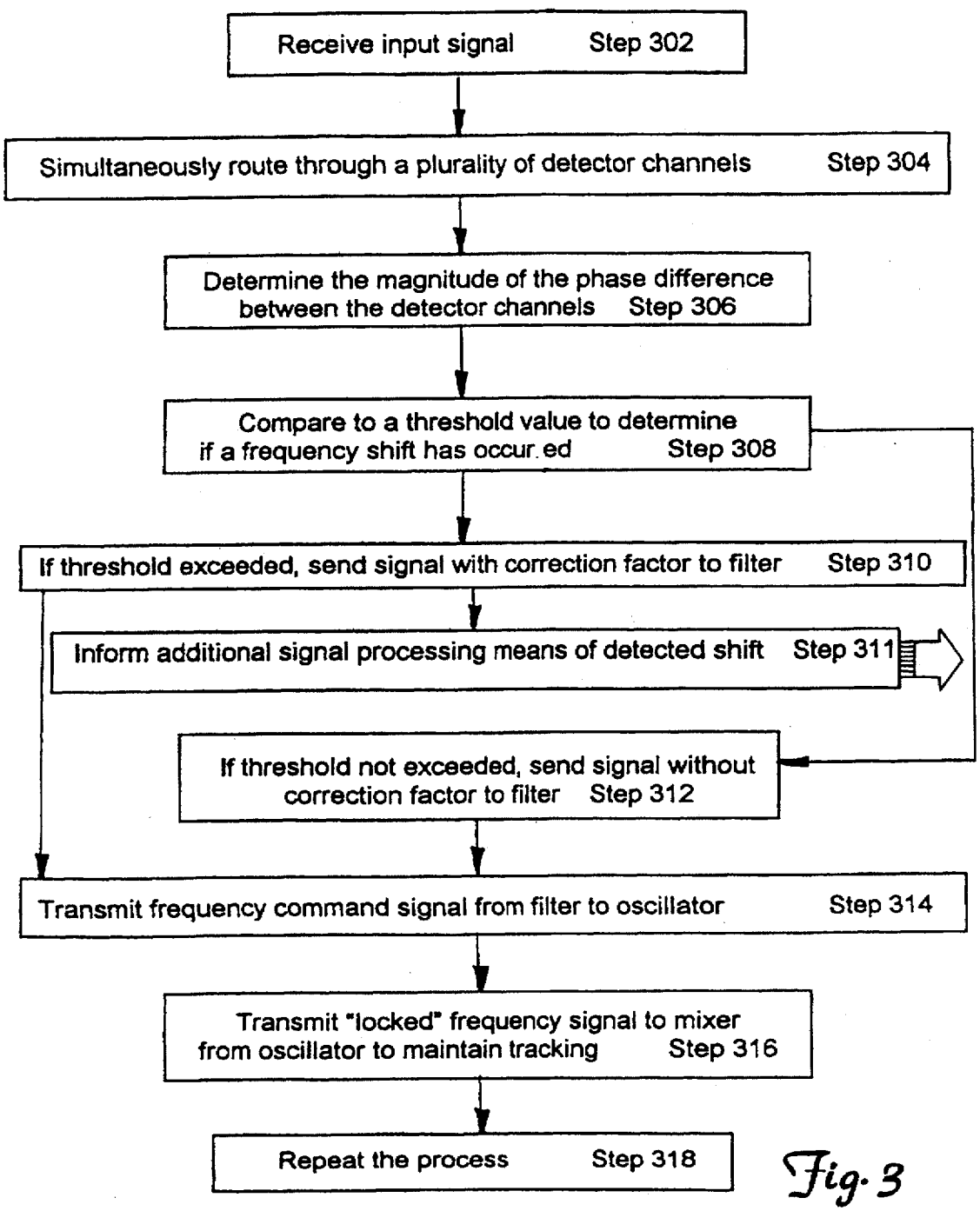
FIG. 3 illustrates a flow chart implementing the steps associated with practicing the disclosed invention in the device described in FIG. 2.

FIG. 3 provides a high level flow chart of each step for the process of maintaining loop lock that is utilized by the apparatus of FIG. 2 above. In step 302, a complex mixer component, having the teachings of the present invention, receives an external reference signal, in this case a complex signal having an in-phase and quadrature phase signal component. The mixer simultaneously provides the received external signal to more than one detector channels, step 304. In the case above, two detector channels are utilized although it is understood that the benefits of the present invention could also be practiced with a plurality of detector channels, each configured to provide signal characteristics from a unique perspective. The magnitude of the value of the difference in the detector channels is next determined, step 306. Having determined the value of the magnitude of the difference in the detector channel phass measurements, such value is compared to an established threshold, in the instant case ninety degrees, step 308.

Should the comparison in step 308 indicate that a shift has occurred, then an appended correction signal is transmitted to the loop filter, step 310. Alternatively, should the comparison of step 308 indicate no shift has occurred then no additional correction is included in the signal transmitted to the loop filter, step 312. For the instant case, the correction signal is derived by using the five millisecond pre-detection integration phase difference, reducing the loop filter order from a value of three to two, and to change the loop coefficients to indicate a detected shift response. Additionally, the existence of a phase shift may be routed to additional processing means for other signal processing steps such as disregarding or assigning a weighting factor to such portion of the processed signal, step 311.

The loop is completed by the filter allowing a frequency command signal to be routed to a DCO. The frequency command signal is comprised of either the correction input from a detected phase shift or alternatively contains no shift response, step 314. The DCO is coupled to the mixer and is comprised of a signal in response to the received frequency command signal, step 316. The process then repeats in an iterative fashion, step 318.

While particular embodiments of the present invention have been shown and described, it should be clear that changes and modifications may be made to such embodiments without departing from the true scope and spirit of the invention. It is intended that the appended claims cover all such changes and modifications.

We claim:

1. A tracking loop for maintaining lock on a transmitted signal, comprising:

a mixer having an input signal that represents a processed digital value of the transmitted signal;

an oscillator coupled to the mixer and providing a signal of a predetermined frequency for generating a tuning signal for the tracking loop;

a plurality of phase detectors operating simultaneously at different sampling rates and each coupled to the mixer in such manner as to have the mixer output signal as the input signal for each phase detector;

means for determining the difference between the output values of each phase detector and at least one of the other phase detectors, said means having input ports coupled to the output signal of each detector;

a comparator, coupled to the determining means that evaluates the magnitude of the difference values of said phase detectors to a predetermined threshold value; and a filter coupled to the comparator for receiving an input signal and the oscillator for providing an input signal to said oscillator;

whereby the loop filter is provided an additional input signal if the comparator evaluation indicates that the threshold value is exceeded.

2. The apparatus of claim 1, wherein the plurality of detectors is comprised of two detectors.

3. The apparatus of claim 1, wherein one of the detectors operates at a sampling rate of five milliseconds.

4. The apparatus of claim 1, wherein one of the detectors operates at a sampling rate of twenty milliseconds.

5. The apparatus of claim 1, wherein one of the detectors is comprised of an integrator, an arctangent detector and a phase difference detector, cascadely coupled to each other.

6. The apparatus of claim 1, wherein the detector operating at the shortest sampling interval is comprised of a first integrator that operates over the sampling period N, an arctangent detector, a phase difference detector and a summer, cascadely coupled to each other.

7. The apparatus of claim 1, wherein the compensating signal is derived from the value of the detector having the shortest sampling period.

8. The apparatus of claim 1, further including coupling the comparator to additional signal processing means and transmitting occurrences of exceeding the comparator threshold value.

9. A tracking loop for maintaining lock on a transmitted signal, comprising:

a mixer having an input signal that represents the in-phase and quadrature components of the transmitted signal;

an oscillator coupled to the mixer and providing a signal of a predetermined frequency for generating a tuning signal for the tracking loop;

a plurality of phase detectors that may be operating simultaneously at different sampling rates and each coupled to the mixer in such manner as to have the mixer output signal as the input signal for each phase detector;

means for determining the difference between the output values of each phase detector and at least one other phase detector, said means having input ports coupled to the output signal of each detector;

a comparator, coupled to the determining means that evaluates the magnitude of the difference values of said phase detectors to a predetermined threshold value; and a filter coupled to the comparator for receiving an input signal and the oscillator for providing an input signal to said oscillator;

whereby the loop filter is provided an additional input signal if the comparator evaluation indicates that the threshold value is exceeded.

10. The apparatus of claim 9, wherein the plurality of detectors is comprised of two detectors.

11. The apparatus of claim 9, wherein one of the detectors operates at a sampling rate of five milliseconds.

12. The apparatus of claim 9, wherein one of the detectors operates at a sampling rate of twenty milliseconds.

13. The apparatus of claim 9, wherein one of the detectors is comprised of an integrator, an arctangent detector and a phase difference detector, cascadely coupled to each other.

14. The apparatus of claim 9, wherein the detector operating at the shortest sampling interval is comprised of a first integrator that operates over the sampling period N, an arctangent detector, a phase difference detector, and a summer, cascadely coupled to each other.

15. The apparatus of claim 9, wherein the compensating signal is derived from the value of the detector having the shortest sampling period.

16. The apparatus of claim 9, further including coupling the comparator to additional signal processing means and transmitting occurrences of exceeding the comparator threshold value.

17. The apparatus of claim 9, wherein the transmitted signal is a global positioning satellite signal.

18. A method of processing a transmitted signal utilizing a tracking loop for signal processing comprising the following steps:

receiving the input signal at the mixer;

simultaneously routing the output signal from the mixer to a plurality of detectors;

determining the magnitude of the phase differences between the detector channels;

comparing the magnitude of the phase differences between the detector channels to a predetermined threshold value to determine if a phase shift in the loop oscillator has occurred;

declaring a phase shift if the threshold value is exceeded;

transmitting a correction signal to the tracking loop filter;

transmitting a command from the tracking loop filter to the oscillator that includes a correction signal;

transmitting a reference signal from the oscillator to the mixer in order to achieve loop lock; and repeating, in an iterative fashion, the above process.

19. The method of claim 18 further including the step of informing additional signal processing means, other than the tracking loop, of the declared phase shift in order to assign a weighting factor value to associated signal data.

20. The method of claim 18 wherein the correction signal is based upon an output signal from the one detector of the plurality of detectors that has the shortest sampling period.

* * * * *